United States Patent [19]
Morong, III

[11] Patent Number: 5,101,153
[45] Date of Patent: Mar. 31, 1992

[54] PIN ELECTRONICS TEST CIRCUIT FOR IC DEVICE TESTING

[75] Inventor: William H. Morong, III, Foxcroft, Me.

[73] Assignee: National Semiconductor Corporation, Santa Clara, Calif.

[21] Appl. No.: 639,823

[22] Filed: Jan. 9, 1991

[51] Int. Cl.$^5$ ............................................. G01R 31/28
[52] U.S. Cl. ................................ 324/158 R; 324/73.1; 371/22.1; 371/27
[58] Field of Search .............. 324/158 R, 73.1, 158 F; 371/22.1, 22.6, 25.1, 27

[56] References Cited

U.S. PATENT DOCUMENTS 3,927,371 12/1975 Pomeranz et al. ..................... 371/27
4,354,268 10/1982 Michel et al. ....................... 324/73.1
4,646,299 2/1987 Schinabeck et al. ................ 324/73.1

Primary Examiner—Ernest F. Karlsen
Attorney, Agent, or Firm—James W. Rose; Daniel H. Kane

[57] ABSTRACT

A pin electronics test circuit applies test signals at a pin of an ECL integrated circuit (IC) device under test (DUT) and senses and measures pin signals received from a pin of the DUT. The pin electronics test circuit incorporates test signal first and second electrical paths (TL1, TL2) (TL11, TL12) with respective test connect and disconnect first and second nodes (n1)(n2). First and second termination circuits (RL1, A1)(RL2,A2), first and second DC test signal generators (A1 etc.) (A2 etc.) for forcing DC test signal voltages and currents, AC test signal generator ($I_{HI}$, $I_{LO}$ etc.) for switching between and driving AC test signals of high and low potential levels, and pin signal sensing and measuring circuits (CR1, 8CR2) are all contained on a single pin electronics card (PEC) (54) or formed as a single unit for a pin or complementary pair of pins of the DUT. Electronic switches including FET switches (S1,S3,S4,S5,S6,S7) and current sink switches (S2,S8,S9) permit rapid reconfiguration of the components of the pin electronic circuit with respect to the pair of test signal paths for testing in each of the different required testing modes for single ended, complementary output, and bus type ECL devices. The impedance discontinuities caused by electromechanical relays are eliminated permitting controlled impedance test signal paths. The pin electronics test circuit unit permits comprehensive testing including DC parameter tests, AC parameter tests, and AC or dynamic function tests.

32 Claims, 6 Drawing Sheets

PIN ELECTRONICS TEST CIRCUIT FOR IC DEVICE TESTING

CROSS REFERENCE TO RELATED PATENT APPLICATION

This patent application is related to U.S. Patent application Ser. No. 07/639,586 filed, Jan. 9, 1991, and entitled MECHANICALLY COMPLIANT HIGH FREQUENCY ELECTRICAL CONNECTOR, inventor James E. Milan. Both patent applications are assigned to a common assignee.

TECHNICAL FIELD

This invention relates to new pin electronics test circuits for applying test signals at a pin of an integrated circuit (IC) device under test (DUT) and for sensing and measuring pin signals received from a pin of the DUT in response to the test signals. For microprocessor controlled digital logic IC device testers currently used, the locus of the invention is in the so called test head where the test circuits are formed on pin electronics cards or boards (PEC's) corresponding to the respective pins of a DUT. The PEC's "drive" AC test signals and "force" DC test signals at respective pins of a DUT, and sense and measure pin signals stimulated at the same or other pins. The invention provides new and improved test circuits for performing the device testing particularly applicable to high speed ECL devices including single ended output, complementary output, and bus type ECL devices. The invention also provides related improvements in the load board or DUT board on which the DUT is mounted, and in controlled impedance couplings and paths through test head components to a DUT.

BACKGROUND ART

An important phase in the manufacture and production of IC devices is product testing to assure that each device meets required specifications. Such testing is performed at a test station or test system simply referred to as a "tester". In the case of digital logic IC devices, the tester performs a variety of tests including DC parameter tests, AC parameter tests and AC function or dynamic function tests.

In DC parameter testing, a constant voltage is "forced" at a pin of the DUT and the resulting current at the same or other pins is sensed and measured. Similarly a constant current is forced at a pin of the DUT and the resulting voltage is sensed and measured at the same or other pins. Such stimulating test signals are referred to herein as DC test signals and the responses are referred to as pin signals or DC pin signals. The designation "DC" is used because the DC test signal generator applies constant or steady state voltages or currents at a pin of the DUT for sensing and measuring the steady state characteristics of the DUT.

In AC parameter testing, AC test signals are applied at an input pin of the DUT in the form of data test signals of logic high and low potential levels. Generally the propagation times of the AC test signals through the device and the transition times between logic levels at an output pin of the DUT are sensed and measured. Typically the AC parameter testing measures the propagation times and transition times between logic high potential level signals H, logic low potential level signals L, and high impedance cut off states Z at respective pins of the DUT. The designation "AC" is used because the AC test signal generator generates and switches between data test signals of high and low potential levels and drives the alternating test signals at a pin of the DUT. It is the switching characteristics of the DUT that are sensed and measured at the respective pins.

The function testing of the DUT, also referred to as the AC function testing or dynamic function testing also uses AC test signals but in defined patterns and series at the respective pins of the DUT defined by "truth table" function tests. The testing circuits measure the logic response at the respective output pins of the device and the capability of the DUT to perform its intended logic functions in accordance with the device truth tables. The designation "AC" is used because the AC function testing utilizes the AC test signals of logic high and low potential levels. AC function testing is also used to validate the required voltage levels and timing of the responding AC pin signals. The signals sensed and measured at respective pins of the DUT in response to AC test signals for either AC parameter testing or AC function testing are referred to herein as pin signals or AC pin signals.

The major components of a tester include a CPU controller such as a microprocessor, a power supply which includes a number of power supply units, and a test head which houses the testing circuits and on which the DUT is mounted. A human operator or automated program selects, directs, controls and monitors the DC parameter testing, AC parameter testing and AC function testing at a CRT display and keyboard of the CPU controller. Some testers are more fully automated than others.

The CPU controller includes a function memory which may be a combination of RAM and disk memory for storing AC test data such as AC function operands or vectors and AC test control signals which direct the AC parameter tests and AC dynamic function tests on a DUT mounted on the test head. The microprocessor runs test programs which transfer selected AC function vector data and AC control signal data to the test head for performing particular tests.

The test head contains the test circuits that actually perform the selected tests on a DUT. Each pin of the DUT is separately controlled by separate test circuits formed on a separate pin electronics card (PEC). There is generally one PEC for each pin or group of pins of the IC device being tested. The PEC's are typically vertically mounted in a radial distribution on a so called motherboard. The motherboard includes an interface board and buses for receiving selected function test data and test control signals from the microprocessor controller and distributing them to the respective PEC's. The device being tested is plugged into a load board which is in turn mounted on the PEC's. In high speed production, automated handlers perform this function and "index" the DUT in automatically activated sockets known as contactors. Connectors on each PEC provide continuity of test signal electrical paths from the test circuits on the PEC's through the connectors to the DUT board and to the pins of the DUT.

Other typical components of the test head may include a function sequencer which retrieves and sequences the AC function test data for a function test and delivers the function test data to the PEC memory on a pin electronics card. A timing generator generates programmable clock pulse signals and a reference generator provides the accurate reference voltages for AC parameter and function testing.

The testers relevant to the present invention are known as "distributed resource" testers in contrast to so-called "shared resource" testers. Each PEC contains the test circuits for a single pin or group of pins of a DUT mounted on the load board. Each PEC includes the DC test circuits and DC parameter testing components for forcing DC test signal steady state voltages and currents and for sensing and measuring resulting pin signal currents and voltages. The high speed logic circuits for AC parameter tests and AC function tests are also located on each PEC along with the AC comparators. A termination circuit is provided on the PEC for receiving AC pin signals from a DUT pin during AC parameter and AC function tests. This consolidation of test circuits on the PEC is intended to reduce the electrical conductor paths for test signals from the test circuits to the DUT pins and similarly reduce the path for resulting pin signals from the DUT pins to the sensing and measuring comparators to minimize degradation of signals.

In the testers of interest to the present invention, an AC test signal generator or driver circuit is provided on each PEC for sending or driving logic high and low potential level data test signals to a DUT pin. An AC pin signal measurement circuit including a comparator senses the logic high and low potential level AC pin signals received from a DUT pin and determines whether the timing and voltage levels of the signals are correct. The programmable termination circuit on the PEC provides for example a 50 ohm ECL termination for receiving the pin signals.

For AC function tests the PEC includes a function operand or function vector RAM memory for storing the selected truth table function test data. The AC test signal pin driver circuit which is also referred to as the AC function driver circuit converts the function test data to proper logic high and low potential level data test signals to apply at the DUT input pins. The AC test signal driver applies the correct function test pattern to the DUT pin. The AC comparators on the PEC sense the pin signals returning from the DUT output pins and determine the validity of the sensed signals. A separate AC measurement board may be provided to supplement the AC comparator for measuring the time between wave form edges of AC test signals and pin signals during AC parameter testing.

For DC parameter testing, the PEC includes a D/A convertor which receives an appropriate test control digital signal and converts it to a voltage or current. This is used by the DC test signal generator or driver circuit to generate and force a steady state test signal voltage or test signal current.

In a typical distributed resource tester, both the DC test signal circuits and the AC test signal circuits are coupled to the same test signal path from the pin electronics card through the PEC/DUT board connector, and the DUT board, to a pin of a device being tested. During DC parameter testing, the AC test signal circuitry must be disconnected from the test signal electrical path while conversely during AC parameter and function testing the DC test signal circuitry must be disconnected from the test signal electrical path. To accomplish the connecting and disconnecting functions, electromechanical relays are typically used.

Such a microprocessor controlled digital IC tester is described for example in the MCT 2000 R SERIES TEST SYSTEMS HARDWARE MANUAL, Publication Number 010193B, Revision B, Nov. 1, 1986, C 1986 MCT, by Micro Component Technology Inc., 3850 North Victoria Street, P.O. Box 64013, St. Paul, Minn. 55164. This Manual contains the following notice by MCT: "The information contained herein is proprietary and is not to be released or reproduced without the written permission of an officer of Micro Component Technology, Inc." Particular reference is directed to "Chapter 1: System Description".

A disadvantage of conventional testers is that the test signal electrical path from the PEC to the pin of a DUT is a poorly controlled impedance path which corrupts the wave form of driving AC test signals and responding AC pin signals. The relays in particular introduce a discontinuity of path impedance which unacceptably corrupts wave forms in the testing of high speed ECL IC devices.

Furthermore the conventional testers typically provide only a single test signal electrical path from the PEC to the DUT. Such testers are generally adequate only for testing single ended output ECL devices where the DUT constitutes an effective transmission line series termination at the end of the test signal electrical path. In order to test bus type ECL IC devices, a transmission line parallel termination must be provided at the DUT end of the test signal electrical path. This is typically accomplished by adding the required bus termination circuitry on the DUT board or load board at the DUT end of the test signal electrical path. Relays are required to remove the bus termination circuitry during DC parameter testing, introducing further impedance discontinuities in the test signal electrical path.

Some testers have implemented dual test signal electrical paths to a single pin of a DUT for testing bus type DUT's with a transmission line (TL) parallel terminated end. Such testers however still do not provide complementary AC test signals and complementary test signal electrical paths on the PEC's for testing complementary output or differential output type ECL devices. Differential output ECL devices are tested in conventional testers generally by using two separate pin electronics cards operating in opposite complementary phases and generally sequentially. Timing skews between the cards limit the resolution of this conventional method particularly with respect to newer high speed ECL devices.

OBJECTS OF THE INVENTION

It is therefore an object of the present invention to provide new pin electronics test circuits for applying test signals at a pin of a DUT and for sensing and measuring pin signals received from a pin of the DUT over improved test signal electrical paths with controlled substantially constant impedance. The invention is intended to perform both DC parameter testing and high speed AC parameter and dynamic function testing over test signal electrical paths without the impedance discontinuities introduced by relays. The invention also avoids the limited life and unreliability of electromechanical relays.

Another object of the invention is to provide pin electronics test circuits suitable for testing high speed digital logic ECL devices including single ended output ECL devices, bus type ECL devices, and complementary output or differential output type ECL devices. To this end, the pin electronics test circuits accommodate different DUT loadboards dedicated to the particular ECL product types. The invention provides rapid reconfiguration of the pin electronics test circuits for testing the different types of ECL DUT's mounted in the appropriate DUT board. The circuits perform either DC parameter tests or AC parameter and function tests. The objective is to provide automated reconfiguration of the pin electronics test circuits after indexing the DUT in the contactors of the corresponding dedicated DUT board for performing all of the different required tests for all the different types of ECL parts from the same PEC and without impedance discontinuities. The invention also avoids the necessity of providing alternative TL series and parallel terminations on the DUT board and eliminates any relays in the vicinity of the DUT.

A further object of the invention is to provide all of the pin electronic circuitry for performing the required DC parameter tests and AC parameter and function tests on a single pin electronics card including the circuitry for testing complementary output type ECL parts with simultaneous complementary AC test signals.

In the following Disclosure of the Invention, Detailed Description and Claims, the invention is explained by reference to a variety of "switches", "electronic switches", or "switch means". This switch terminology is intended to include within its scope a variety of switching structures and functions incorporated in the pin electronics test circuits of the invention. The reference to a switch or electronic switch may correlate with a discrete or explicit switch component at the specified location or to a number of coacting components that operate or coact together to perform a switching type function at the identified location in the circuit even though the components are at other locations. The switch terminology used herein refers to electronic switches and electronic switching functions for electrically actuating or deactuating circuit functions rather than physically mechanically connecting and disconnecting circuit parts.

For example a diode may be located at an identified switching node or switch location but be remotely actuated from components at locations remote from the site where a switching function is performed. The switch terminology of the specification is intended to encompass electronic switching functions for example performed by FET transistor elements in electrically turning on and off conduction in a current path, current sink current switch circuits such as differential transistor pair voltage amplifier gates for switching currents between alternative paths rather than switching currents on and off, and diode elements biased above and below the threshold level of the particular diode.

The word switch and phrase electronic switch are intended to encompass a switching function or "virtual" switch effected by circuit elements. As stated above the switching, coupling, actuating or conducting function at a specified location may be the result of coacting operation of remote components. This is also subsumed under the name "switch means" in the claims, employing the statutory means language permitted by 35 USC Section 112. With this clarification of the switch terminology used in this specification, the disclosure of the invention is as follows.

DISCLOSURE OF THE INVENTION

To accomplish these results the invention provides pin electronics tests circuitry formed as a single unit for each pin or pair of complementary pins of a DUT. For example, the pin electronics test circuit unit may be formed on a PEC. Each unit of the pin electronics test circuitry provides all the test circuit configurations for comprehensive testing particularly applicable to high speed ECL IC devices.

A first electrical path with a test connect and disconnect first node defines a test signal path between the first node and a first path coupling for electrical connection to a pin of a DUT. A first terminating resistor and first terminating voltage source are coupled in series to the first node providing a transmission line parallel termination for the first electrical path for receiving pin signals from a pin of a DUT. A first electronic switch electrically connects and disconnects the first terminating circuit with respect to the first node.

An AC test signal generator or driver circuit is coupled to the first node for generating and switching between AC test signals in the form of data test signals of logic high and low potential levels. The AC test signal generator drives the AC test signals on the first electrical path for stimulating a pin of a DUT. A second electronic switch electrically connects and disconnects the AC test signal generator with respect to the first node.

Similarly a DC test signal generator or forcing circuit is coupled to the first node for generating and forcing DC test signals. The DC test signal generator includes a steady state voltage generator for generating a substantially constant voltage level on the first electrical path and forcing the selected voltage level at a pin of a DUT. The DC test signal generator also includes a steady state current generator circuit for generating a substantially constant current on the first electrical path and forcing the selected current at a pin of the DUT. A third electronic switch electrically connects and disconnects the steady state voltage generating circuit with respect to the first node and a fourth electronic switch electrically connects and disconnects the steady state current generating circuit with respect to the first node.

First sensing and measuring circuitry is also coupled to the first node for sensing and measuring pin signals from a pin of a DUT in response to the test signals. A comparator may be used for sensing and measuring AC pin signals in response to AC test signals while a voltmeter or other voltage sensing and measuring circuit arrangement may be used for sensing and measuring DC pin signals.

A feature of this arrangement is that the pin electronics circuit components may be switched to any required configuration for comprehensive testing of single ended high speed ECL devices. DC parameter tests, AC parameter tests, and dynamic function tests are performed sequentially through electronic switching without the impedance discontinuities introduced by conventional relays.

According to the invention the pin electronics test circuit unit for example in the form of a PEC, incorporates a second electrical path with a test connect and disconnect second node similar to the first node providing another test signal path between the second node and a second path coupling for electrical connection to a pin of a DUT. A second terminating resistor and second terminating voltage source are coupled in series to the second node providing a transmission line parallel termination for the second electrical path for receiving pin signals from a pin of a DUT. A fifth electronic switch similar to the first electronic switch electrically connects and disconnects the second terminating circuit with respect to the second node.

An advantage of this further arrangement of the invention with dual test signal electrical paths on the pin electronics test circuit unit or PEC is that now the pin electronics test circuit components may be electronically switched to provide all the required test circuit configurations for all types of ECL devices. Comprehensive testing is available for high speed differential or complementary output ECL IC devices and ECL bus type devices as well as the single ended output ECL devices.

For testing complementary output ECL devices, a second DC test signal generator or forcing circuit may be coupled to the second node for generating DC test signals. A second steady state voltage generating circuit generates a DC voltage level and a second steady state current generating circuit generates a selected DC current. A sixth electronic switch similar to the third electronic switch electrically connects and disconnects the second steady state voltage generator circuit with respect to the second node. A seventh electronic switch similar to the fourth electronic switch electrically connects and disconnects the second steady state current generating circuit with respect to the second node. A second sensor is coupled to the second node for sensing and measuring pin signals from a pin on the test signal second electrical path.

For performing the AC parameter tests and AC function tests on a differential ECL device the AC test signal generator is a complementary output signal driver circuit having complementary first and second outputs for delivering respective logic high and low potential level data test signals in opposite phase. The complementary first output is coupled to the first node and the second electronic switch electrically connects and disconnects the first output with respect to the first node. The complementary second output is coupled to the second node and an eighth electronic switch electrically connects and disconnects the second output with respect to the second node.

To complete the pin electronics test circuit for testing high speed complementary output ECL devices, the first path coupling of the test signal first electrical path and the second path coupling of the test signal second electrical path are electrically connected to different pins of a DUT. Thus each pin electronics test circuit unit is applicable to a pair of complementary pins in the case of complementary mode testing. The DUT board dedicated for testing complementary output ECL parts provides first and second electrical path continuations to the separate complementary input pins of the DUT for test signal driving, and to the separate complementary output pins for pin signal sensing and measuring. A feature and advantage of this arrangement is that the comprehensive testing of a high speed differential output ECL device is accomplished at the same time through the complementary circuit paths of the ECL DUT from the separate complementary input pins and the separate complementary output pins. Testing is accomplished from the same pin electronic circuit unit or PEC with reduced timing skew between signals on the respective complementary test signal paths.

During driving of AC test signals in the differential or complementary mode, the complementary outputs of the AC signal generator are coupled respectively to the first node of the first electrical path and the second node of the second electrical path for driving complementary AC test signals at two separate complementary input pins of the ECL device. The second and eighth electronic switches are closed. For sensing and measuring AC pin signals at complementary output pins stimulated by the complementary AC test signals, the first and second terminating circuits are coupled respectively to the first node of the first electrical path and the second node of the second electrical path. The first and fifth electronic switches are closed. Thus the pin electronic circuit unit or PEC may be switched or reconfigured between transmitting or talking and receiving or listening.

For testing high speed bus type ECL IC devices, the first path coupling of the test signal first electrical path and the second path coupling of the test signal second electrical path are electrically connected to the same pin of a DUT. Thus a DUT board dedicated for testing bus type ECL devices is provided with first and second electrical path continuations connected to the same pin socket for testing bus type DUT's in the bus mode. The second electronic switch is closed connecting the AC test signal generator to the first node only and the fifth electronic switch is closed connecting the second terminating circuit to the second node. By this arrangement a bus type transmission line parallel termination is provided for driving AC test signals and performing the AC parameter tests and dynamic function tests. For forcing DC test signals and performing the DC parameter tests in the bus mode coupling, the parallel termination may be effectively eliminated by switching to a boot strap termination canceling current on the simulated bus beyond the DUT.

For sensing pin signals from a pin of a bus type ECL device, the first and fifth electronic switches are closed providing effective transmission line parallel terminations at the first and second electrical paths of the pin electronics test circuitry. Both ends of the simulated bus are able to receive or listen to pin signals from the same pin of a DUT through the first and second sensors coupled to the first and second nodes.

Typically a DUT board or load board is provided with pin contactors for mounting or indexing a DUT for testing. According to the invention the DUT board is formed with a first electrical path continuation to a pin socket and a second electrical path continuation to a pin socket. An interconnect interface or connector with first and second electrical contacts electrically connects the PEC and DUT board with electrical continuity between the first electrical path and first electrical path continuation and between the second electrical path and second electrical path continuation. For testing differential type ECL devices the first and second electrical path continuations are connected to the different complementary pin sockets. For testing single ended output ECL devices, only one of the electrical paths is connected to an appropriate pin. For testing bus type ECL parts the first and second electrical path continuations are coupled to the same pin socket for testing in the bus mode.

In the case of testing single ended output ECL devices, both of the first and second electrical path and the first and second electrical path continuations are driven with test signals even though only one electrical path and path continuation is coupled to a pin of the DUT. This avoids unbalanced ground currents which may produce noise in the test circuit. The unconnected path provides a balanced transmission line to cancel and reduce the ground currents and noise.

For single ended output ECL device testing, the AC test signal generator is a three level current switch coupled to the first node. The three level current switch alternatively establishes a first high level current through the first terminating resistor for a logic high potential level data test signal at the first node or a second low level current through the first terminating resistor for a logic low potential level data test signal at the first node. For a third level, the three level current switch turns off the current below a threshold level for disconnecting the AC signal generator from the first node. In this respect, the third or turn off level of the three level current switch constitutes the second electronic switch, connecting and disconnecting the AC test signal generator with respect to the first node.

In the preferred example embodiment the AC test signal generator incorporates a first current source coupled to the first node through a disconnect diode element oriented for conduction of current to the first node. The first current source is coupled between a high potential level power rail and the disconnect diode element for sourcing current through the terminating resistor and establishing a logic high potential level data signal at the first node. A logic level current sink switch or ninth electronic switch is coupled between the anode lead of the disconnect diode element and a low potential level power rail for diverting a first fractional portion of current from the first current source away from the disconnect diode element and terminating resistor. The logic level current sink switch when closed establishes the logic low potential level data test signal at the first node.

In the preferred example the second electronic switch is a disable current sink switch coupled between the anode lead of the disconnect diode element and a low potential level power rail. The disable current sink switch diverts a second fractional portion of current from the first current source away from the disconnect diode element sufficient to cause the potential drop across the disconnect diode element to fall below the diode element threshold voltage level. As a result the AC test signal generator is effectively electrically disconnected from the first node.

For testing complementary output ECL devices, the AC test signal generator or driving circuit in the preferred embodiment is more involved, essentially a pair of three level current switches with complementary control or coordination. In addition to the first current source coupled to the first node of the first electrical path through a first disconnect diode element, a second current source is coupled to the second node of the second electrical path through a second disconnect diode element oriented for conduction to the second node. The second current source is coupled between a high potential level power rail and the second disconnect diode element for sourcing current through the second termination resistor and establishing a logic high potential level data test signal at the second node.

According to the preferred example a ninth electronic switch in the form of a differential logic level current sink switch with a pair of differential transistors provides complementary first and second logic level current switch paths with complementary outputs. The first current switch path is coupled between the anode lead of the first disconnect diode element and a low potential level power rail for diverting a first fractional portion of current from the first current source away from the first disconnect diode element and first terminating resistor. The first current switch path when closed therefore establishes a logic low potential level data test signal at the first node. The second current switch path is coupled between the anode lead of the second disconnect diode element and a low potential level power rail for diverting a first fractional portion of current from the second current source away from the second disconnect diode element and second terminating resistor. The second current switch path when closed therefore establishes a logic low potential level data test signal at the second node. The first and second logic level current switch paths are opened and closed in opposite phase with respect to each other by the differential pair of transistors of the ninth switch.

As in the case of the pin electronics test circuit for single ended output ECL devices, the second electronic switch is provided by a first disable current sink switch which diverts a second fractional portion of current from the first current source away from the first disconnect diode element. When the first disable current switch is closed the potential drop across the first disconnect diode element falls below the diode threshold voltage level electrically disconnecting the AC test signal generator from the first node. For complementary output ECL device testing a second disable current sink switch is coupled between the anode lead of the second disconnect diode element and low potential level power rail for diverting a second fractional portion of current from the second current source away from the second disconnect diode element. When the second disable current sink switch is closed, the potential drop across the second disconnect diode element falls below the diode threshold voltage level for disconnecting the AC test signal generator from the second node. Specifically, the second disable current sink switch constitutes the eighth electronic switch. During AC test signal driving for complementary mode testing, both the second and eighth electronic switches are closed.

The terminating voltage source according to the preferred example is provided by a first forcing amplifier such as a first operational amplifier (first op amp) having a controlling signal input, a feedback input, and an output coupled to the terminating resistor. The controlling signal input is typically a controlling voltage signal input directed by the microprocessor controller through the test head and sets the terminating voltage level. The feedback input is provided by a first feedback circuit coupled between the output of the first forcing amplifier and the feedback input. The first feedback circuit establishes a substantially constant terminating voltage at the forcing amplifier end of the first terminating resistor as the first forcing amp equalizes its output voltage with the controlling voltage input. The first electronic switch is coupled in the first feedback circuit for electrically connecting or disconnecting the first terminating circuit with respect to the first node.

The terminating voltage source forcing amplifier is used to advantage to provide the DC test signal generator circuit as follows. The steady state voltage generating circuit for forcing a selected voltage level at a pin of a DUT is provided by a second feedback circuit coupled between the DUT end of the first terminating resistor and the feedback input of the first forcing amp. A substantially constant voltage is therefore "forced" at a pin of the DUT as the first forcing amp equalizes the voltage at the DUT end of the terminating resistor with the controlling voltage signal input. The third electronic switch is coupled in the second feedback circuit for electrically connecting and disconnecting the steady state voltage generating circuit of the DC test signal generator with respect to the first node.

The steady state current generating circuit of the DC test signal generator is provided by a third feedback circuit which includes a first instrumentation amplifier having first and second inputs coupled respectively to the ends of the first terminating resistor. The first instrumentation amp is coupled to provide a current amplifier as follows. The output of the first instrumentation amp is proportional to the current in the terminating resistor. The output of the first instrumentation amp is coupled to the feedback input of the first forcing amp which therefore stabilizes and equalizes the current through the terminating resistor to a pin of a DUT according to the controlling voltage input to the first forcing amp. The first forcing amp therefore forces a DC current at a pin of the DUT. The fourth electronic switch is coupled in the third feedback circuit for electrically connecting and disconnecting the steady state current generating circuit of the DC test signal generator with respect to the first node.

In the preferred example embodiment a similar second DC test signal generator is coupled to the second node of the test signal second electrical path. The DC test signal generator is effectively duplicated for operation of the pin electronics test circuit first and second electrical paths for simultaneous testing at complementary pins of differential output ECL devices. When the first and second DC test signal generators are simultaneously forcing DC test signals at the complementary pins, i.e. when the DC test signal driver circuit is transmitting or talking, one of the third or fourth electronic switches is closed and one of the sixth and seventh electronic switches is closed. When the DUT is responding to DC test signals and transmitting or talking, the pin signal sensors are receiving and listening to DC pin signals and the first and second terminating circuits are coupled respectively to the first and second nodes with the first and fifth electronic switches closed.

As will be apparent, the first, third, and fourth electronic switches are not actually located at the first node. The fifth, sixth, and seventh electronic switches are not actually located at the second node. These switch components are remotely located in the feedback loop circuits and are remotely actuated. However, the switching functions or switching effects of these electronic switches are operative at the first and second nodes effectively electrically coupling, decoupling, actuating, deactuating, and reconfiguring circuits or circuit functions at the first and second nodes.

In the preferred pin electronics test circuit embodiment, the first, third, fourth, fifth, sixth, and seventh electronic switches are FET switches and the second, eighth, and ninth electronic switches are commutating differential current path current sink switches. A feature and advantage of this arrangement is that the components of the single electronics test circuit unit or PEC for each pin or complementary pair of pins of a DUT can be rearranged by electronic switching to achieve all the required configurations for comprehensive testing of high speed ECL devices including single ended output, differential output and bus type ECL devices. Furthermore, the commutating current path or differential transistor pair current sink switches operate at high speed, switching currents between different paths rather than turning currents on and off.

The invention can be embodied in so called pin electronics cards and DUT boards or load boards with interconnecting coupling between the PEC and DUT board for incorporation into and retrofitting conventional microprocessor controlled digital logic IC testers. Alternatively the pin electronics test circuit units of the present invention may be incorporated in entirely new tester machine configurations for example reduced to integrated circuit chips rather than cards and boards. Furthermore the invention may be broken down into separable blocks divided differently from the traditional PEC, connector interface, and DUT board of distributed resource digital logic IC device testers.

More generally the invention provides a pin electronics circuit unit having test signal first and second electrical paths having test connect and disconnect first and second nodes. The first and second electrical paths define separate test signal paths between the respective first and second nodes and respective first and second path couplings for electrical connection to at least one pin of a DUT. First and second terminating circuits including respective first and second terminating resistors and first and second terminating voltage sources are coupled to the respective first and second nodes and provide substantially the function of transmission line parallel terminations for the respective first and second electrical paths for receiving pin signals from at least one pin of a DUT. A first electronic switch electrically connects and disconnects the first terminating circuit with respect to the first node and a fifth electronic switch electrically connects and disconnects the second terminating circuit with respect to the second node.

A test signal generator o driving circuit is coupled at least to the first node for generating and electronically switching between test signals and for applying the test signals on the first electrical path for stimulating a pin of the DUT. A first sensor is coupled to the first node for sensing and measuring pin signals from a pin of a DUT. A second electronic switch electrically connects and disconnects the test signal generator with respect to the first node. By this arrangement the components of the pin electronics test circuit unit may be configured and reconfigured by electronic switching for performing all tests for single ended output ECL devices and bus type ECL devices. With a further electronic switch mediated coupling between the test signal generator and the second node, the pin electronics test circuit unit may be reconfigured for performing all tests for differential or complementary output ECL devices.

Further description of a DUT board or load board and an interface connector for coupling a PEC and DUT board suitable for use with the present invention is found in copending U.S. Patent application Ser. No. 07/639,586 entitled MECHANICALLY COMPLIANT HIGH FREQUENCY ELECTRICAL CONNECTOR, James E. Milan, inventor, and filed Jan. 9, 1991. The contents of the Milan Patent application Ser. No. 07/639,586 are incorporated herein by reference.

Other objects, features and advantages of the inventions are apparent in the following specification and accompanying drawings.

DESCRIPTION OF PREFERRED EXAMPLE EMBODIMENTS, AND BEST MODE OF THE INVENTION

Figure 1:
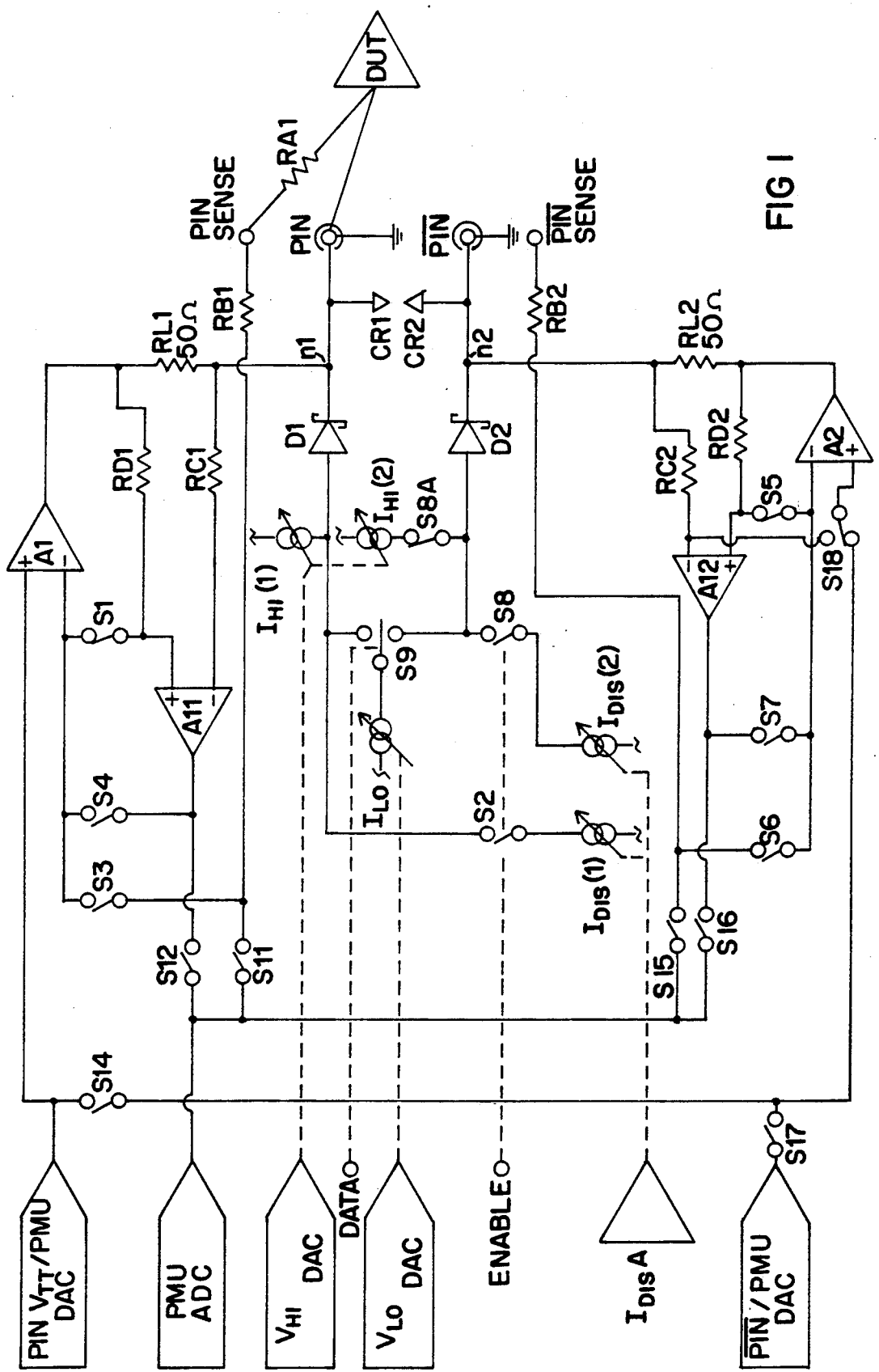
FIG. 1 is a schematic circuit diagram of a pin electronics test circuit according to the invention in the single ended mode configuration for testing a single ended output ECL IC DUT. The circuit can be reconfigured as shown in FIGS. 4 and 6 for testing high speed bus type and complementary output ECL IC devices as well as the single ended output ECL IC devices. The pin electronics test circuit is coupled to a pin of the ECL IC DUT for DC parameter tests, AC parameter tests and AC function tests.

The basic pin electronics test circuit according to the invention is illustrated in FIG. 1. The electronic switches S1-S18 of the circuit are in a switch position configuration for testing single ended output ECL devices. In particular, the electronic switches S1-S18 are in a switch position configuration for driving AC test signals at a pin of an ECL DUT. The four different switch configurations for complete testing of a single ended output ECL device are summarized in the four columns of TABLE I and are referred to as the "Single Ended Mode Switch Configurations".

In the Tables I-III switch position symbols are as follows. "O" is switch function open, "C" is switch function closed, "S" is the switching function switching between high and low potential levels, "NS" is not switching or disabled, and S17 and RC2/A12- are the possible switch positions for the bootstrapping switch S18. In Table IV the electronic switch types are indicated as field effect transistor (FET) switch or differential current sink current switch (CSCS). In TABLE IV and as hereafter described the switches associated with operations on the first pin lead electrical path for test signals and pin signals are designated (1), those associated with operations on the second pin lead electrical path for test signals and pin signals are designated (2), and those associated with operations on both paths are designated (1) and (2).

Figure 2:
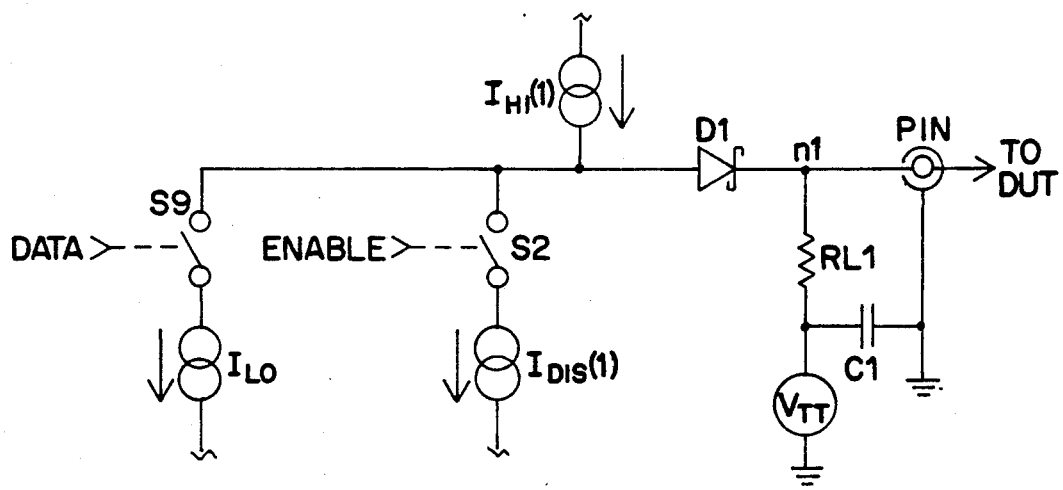
FIG. 2 is a fragmentary schematic circuit diagram of a single electrical path pin electronics test circuit and AC test signal generator according to the invention simplified from FIG. 1. The single electrical path pin electronics test circuit is coupled to a single pin of a DUT for testing single ended output ECL IC devices with AC parameter tests and AC function tests.

The AC test signal generator for driving AC test signals at high and low potential levels is in part provided by components $I_{HI}$, $I_{LO}$, $I_{DIS}$, S9, S2, D1, RL1 and the PIN $V_{TT}$/PMU DAC of FIG. 1. These components are shown in an equivalent simplified circuit of FIG. 2 extracted from FIG. 1 for explanation of the operation of the AC test signal generator. Referring to FIG. 2, the voltage source $V_{TT}$ establishes the terminating voltage at the low voltage end of terminating resistor RL1 on the first test signal electrical path coupled to pin lead coupling node PIN for testing a single ended output ECL DUT. The terminating voltage $V_{TT}$ may typically by $-2.0$ v and the terminating resistor RL1 is typically 50 $\Omega$.

Current source $I_{HI}$ establishes a voltage across terminating resistor RL1 for applying a logic high potential level at node n1 coupled to node PIN, the coupling node or connector node leading to a pin of the DUT. When switch S9 is in the switching mode "S" and closes, current source $I_{LO}$ diverts some of the current from current source $I_{HI}$ lowering the voltage drop across resistor RL1 and applying a logic low potential level at node n1 and coupling node PIN. Switch S9 responds to data signals at the data input DATA for causing either logic high or low potential levels at node n1.

The AC test signal generator provided by these components is effectively electrically disconnected from node n1 by operation of switch S2. When switch S2 is closed, current source $I_{DIS}$ diverts the remaining current from current source $I_{HI}$ until the voltage drop across disconnect diode D1 falls below the diode cutoff voltage. Diode D1 becomes non-conducting and effectively disconnects the AC test signal generator from the test connect/disconnect node n1 while it is not conducting. Current source current switch S2 therefore performs a switching function effective at node n1. Terminating voltage $V_{TT}$ and resistance RL1 then function to receive responding pin signals from the DUT for sensing and measurement for example by comparator CR1 shown in FIG. 1.

Figure 3:
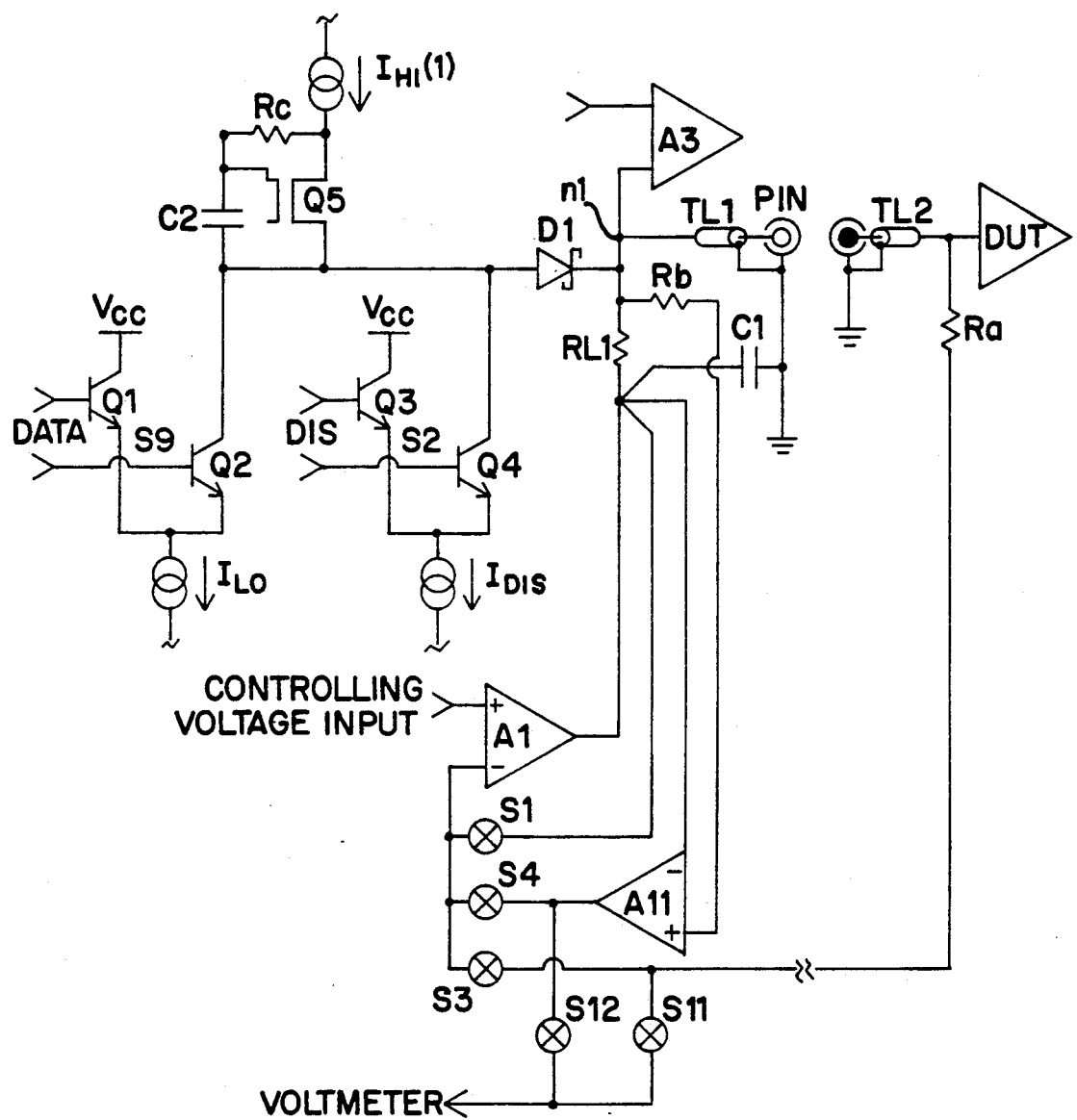
FIG. 3 is a fragmentary schematic circuit diagram of the single electrical path pin electronics test circuit simplified from FIG. 1 including the preferred DC test signal generator for applying DC parameter tests. The preferred AC test signal generator for AC parameter and function tests using differential transistor pair current sink current switches is also shown.

The preferred embodiment of the AC test signal generator is illustrated in the simplified circuit of FIG. 3. FIG. 3 is also extracted from FIG. 1 and shows details of current sink current switches S2 and S9. FIG. 3 also shows additional components A1, A11, S1, S3, S4, S12, S11, R6, Ra, Rb, etc. from FIG. 1 which in part provide the DC test signal generator. In FIG. 3, the test connect and disconnect node n1 is coupled to pin lead coupling node PIN through coaxial cable transmission line TL1 for a controlled impedance pin lead electrical path. The pin lead electrical path continuation is coupled through the adjacent dark centered pin lead continuation coupling node and further coaxial cable transmission line TL2 to a pin of the DUT. The pin lead electrical path of node n1, line TL1, and pin lead connector node PIN is typically on the PEC while the adjacent pin lead continuation connector node, line TL2, and DUT are on the DUT loadboard. An electrical connector of the type described in copending U.S. Patent application Ser. No.

07/639,586 for MECHANICALLY COMPLIANT HIGH FREQUENCY/ELECTRICAL CONNECTOR referred to above provides a controlled impedance coupling between the pin lead coupling node PIN on the PEC and adjacent dark centered pin lead continuation coupling node on the DUT loadboard.

Referring to FIG. 3, the terminating voltage $V_{TT}$ is provided by an op amp forcing amplifier A1. Amplifier A1 applies a voltage equal to the controlling voltage at the "+" input of A1 to the terminating side of resistor RL1 by means of a first feedback circuit. The first feedback circuit contains switch S1 and is coupled to the "−" input of amplifier A1. Switch S1 in effect electrically connects and disconnects the terminating voltage $V_{TT}$ at the low voltage side of terminating resistor RL1 and through RL1 at the node n1. With switch S1 closed, the circuit is in proper configuration for driving AC test signals, and for receiving and measuring AC pin signals using the comparator CR1 of FIG. 1. In FIG. 3, comparator A3 is coupled to sense and measure the AC pin signals.

In order to force a steady state voltage at a pin of the DUT for DC parameter testing, a second feedback circuit is coupled between the DUT pin and the feedback input "−" of op amp A1 with a third switch S3. Op amp A1 forces a DC test voltage at the pin of a DUT equal to the voltage on the controlling voltage input, when switch S3 is closed and switches S1 and S4 are open. Resistor Ra can have a relatively large resistance value to avoid any AC disturbances in the pin lead electrical path. Switch S12 can be closed for DC pin signal current measurements.

In order to force a steady state current at a pin of the DUT as a part of the DC parameter testing, an instrumentation amplifier A11 is coupled across the terminating resistor RL1. The output of instrumentation amplifier A11 is a voltage proportional to the current through RL1 and provides a third feedback circuit through switch S4 to the feedback "−" input of op amp A1. A steady state current is therefore maintained through resistor RL1 to a pin of the DUT in accordance with the controlling voltage input at the "+" input of A1. Resistor Rb prevents AC disturbances in the pin lead electrical path. Additional decoupling resistors are shown in the detailed circuit diagram of the pin electronics circuit in FIG. 1.

The alternative configurations of the switch positions for the DC test signal generator for either DC test voltage forcing and current measuring or DC test current forcing and voltage measuring are summarized in the third and fourth columns of Table I. This Table also summarizes all of the corresponding switch position configurations for the more detailed circuit diagram of FIG. 1.

FIG. 3 shows in more detail the operation of differential current sink current switches (CSCS) for use for the second and ninth switches S2 and S9. Switch S9 is provided by a pair of differential transistors Q1 and Q2. The current generated by current source $I_{LO}$ is alternately switched between the alternative collector to emitter paths provided by transistors Q1 and Q2 in response to input data signals. As shown in FIG. 3 the base nodes of differential pair transistors Q1 and Q2 are coupled to complementary data signal inputs. Alternatively the base node of one of the transistor elements may be coupled to a reference voltage source while the base node of the other transistor is coupled to the data input DATA for receiving logic high and low potential level signals.

Current switch S9 is a high speed switch because it does not turn the current $I_{LO}$ on or off but merely switches current paths. When transistor element Q2 is conducting and transistor element Q1 is off, a portion of the current $I_{HI}$ is diverted and a logic low potential level signal appears at the test connect and disconnect node n1. When transistor Q1 is conducting and transistor element Q2 is off the full current $I_{HI}$, passes through resistor RL1 pulling up the test connect and disconnect node n1 to a logic high potential level.

Similarly the disable switch S2 is provided by a differential transistor pair Q3,Q4. When transistor element Q3 is conducting in response to an enable signal and transistor element Q4 is off, switch S9 operates in the bistate mode applying logic high and low potential level signals at the node n1 in response to data input signals. When transistor element Q4 is conducting in response to a disable signal and transistor element Q3 is off, sufficient current from current source $I_{HI}$ is diverted so that disconnect diode D1 becomes nonconducting and electrically disconnects the AC test signal generator from the test connect and disconnect node n1.

In the example of FIG. 3 current source $I_{HI}$ is a stable DC current source. The AC characteristics of this current source in the switching environment are enhanced by a compensating slave AC current source provided by FET transistor element Q5, high resistance value resistor Rc, and capacitor C2.

In the complete circuit of FIG. 1 it is noted that the AC test signal generator components and DC test signal generator components of FIGS. 2 and 3 operate on a first test signal pin lead electrical path for coupling to a pin of a single ended output ECL DUT device. This first test signal electrical path includes the first test connect and disconnect node n1 and pin lead coupling node PIN as shown in FIGS. 1,2 and 3. In the complete circuit of FIG. 1 effectively all of these components of the AC test signal generator and DC test signal generator are duplicated for operation on a second test signal pin lead electrical path with a second test connect and disconnect node n2 and second pin lead coupling $\overline{PIN}$. Generally a one to one correspondence can be established in FIG. 1. Except for switches, components coupled to the first electrical path have reference designations ending in numeral 1 and components coupled to the second electrical path have reference designations ending with numeral 2. The disable switch S8 for disconnecting the second AC test signal generator on the second electrical path corresponds with switch S2 coupled to the first electrical path. Switch S8 is also a differential transistor pair current sink current switch. Otherwise the remaining switches are FET switches as summarized in Table 4. The operation of the switches in the bus mode and differential mode is hereafter described with reference to FIG. 4/Table II and FIG. 6/Table III.

Figure 4:
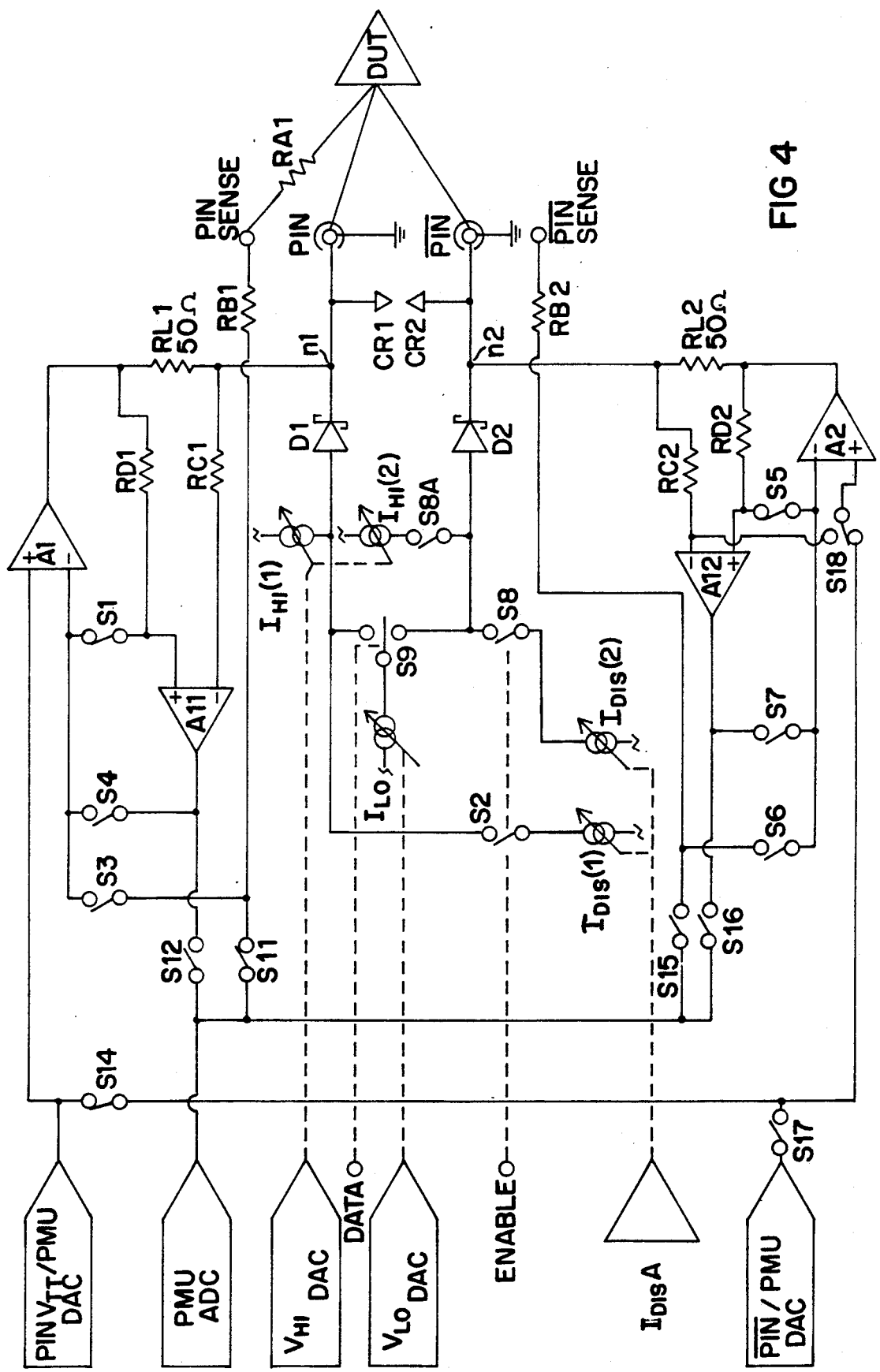
FIG. 4 is a schematic circuit diagram of the pin electronics test circuit according to the invention in the bus mode configuration for testing high speed bus type ECL IC devices. Both the first and second electrical paths are coupled to the same pin of a DUT.
Figure 6:
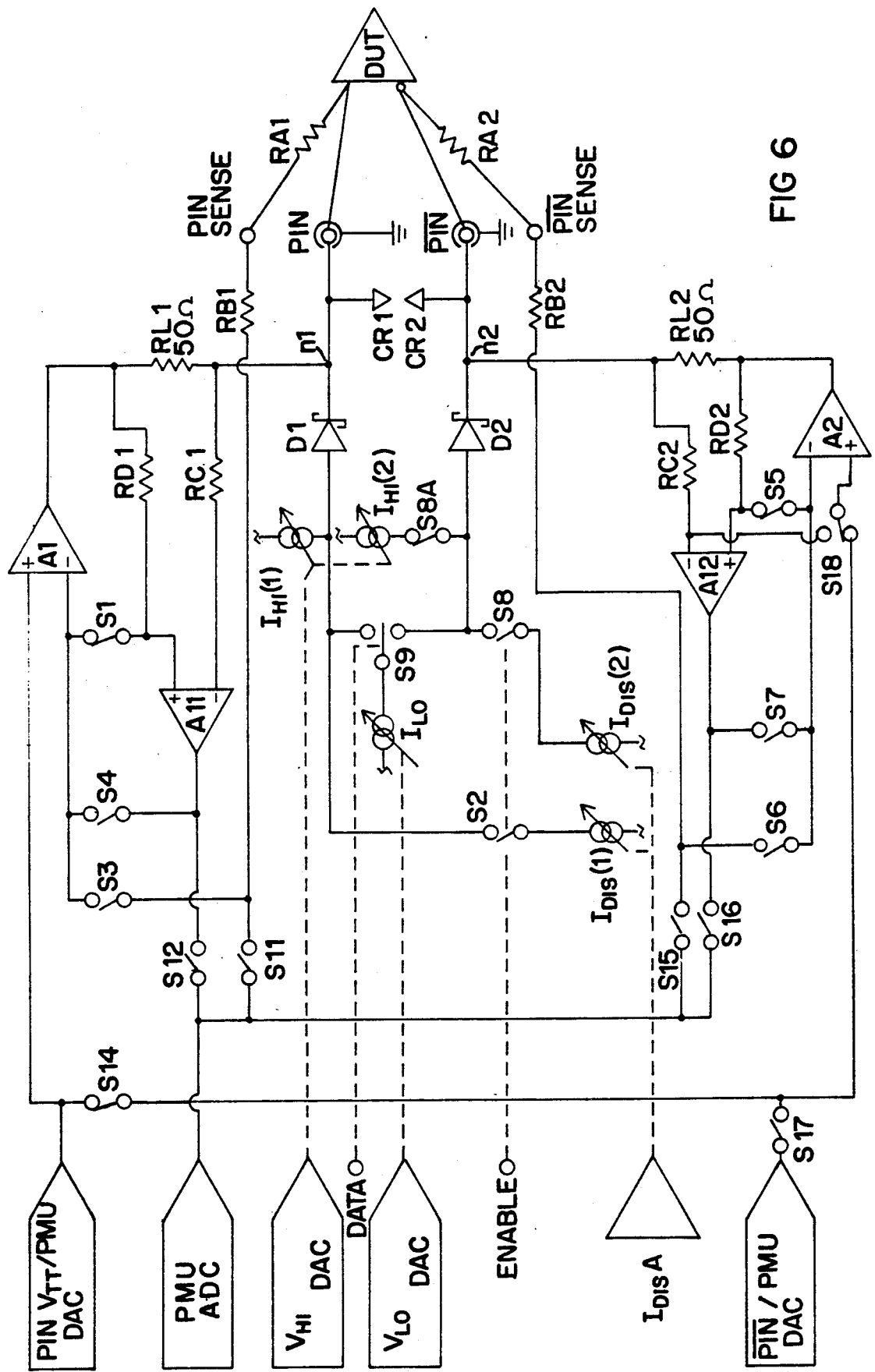
FIG. 6 is a schematic circuit diagram of the pin electronics test circuit according to the invention in the complementary mode configuration for testing high speed complementary output ECL IC devices. The first and second test electrical paths are coupled to separate complementary pins of a DUT.

Other features of the basic circuit of FIGS. 1,4 and 6 include the PIN $V_{TT}$/PMU DAC coupled to the positive or control input of op amp A1 and the $\overline{PIN}$/PMU DAC coupled to the positive or control input of op amp A2. These precision measuring unit digital to analog convertors apply the appropriate controlling voltage input to the respective op amps A1 and A2 in response to digital signals from the CPU controller. The proper terminating voltage and DC test signal voltages are thereby applied at the respective controlling voltage inputs as described.

The PMU ADC or precision measuring unit analog to digital converter receives pin signals and converts the signals for processing and measuring. The $V_{HI}$ DAC and the $V_{LO}$ DAC set the current levels of current sources $I_{HI}$ and $I_{LO}$ and therefore the desired logic high and low potential levels. Similarly the amplifier $I_{DIS}A$ sets the current level of the disable current source $I_{DIS}$.

One element of FIG. 1 which it is not necessary to duplicate for operation of two AC test signal generators on two separate electrical paths is the data switching current source current switch S9. As hereafter described with reference to FIG. 6, switch S9 provides both of the complementary data signals on the alternative first and second pin lead electrical paths at nodes n1 and n2. To accomplish this, the collector leads of both of the differential pair transistor elements Q1 and Q2 of FIG. 3 are utilized. The collector lead of Q1 is coupled to the second logic high potential current source $I_{HI}(2)$ while the collector lead of transistor element Q2 is coupled to the first logic high potential current source $I_{HI}(1)$. In this manner logic high and low potential levels of opposite phase are applied at the same time on the respective first and second pin lead electrical paths at first and second nodes n1 and n2 for complementary mode testing.

Even for testing single ended output ECL devices it is preferable to drive both the active coupled first electrical path and the "dead" decoupled second electrical path with differential or complementary signals. The uncoupled second electrical path provides a balanced transmission line to cancel and reduce ground current noise in the active first electrical path. To this end, switch S8A is closed in the single ended mode test configurations for driving the dead ended second electrical path with a differential signal.

In the basic pin electronics test circuit of FIG. 4 the switch positions are shown in appropriate configuration for driving AC test signals for testing a bus type ECL device in the bus mode. In this switch position configuration, the second pin lead electrical path provided by the pin lead coupling $\overline{PIN}$ and test connect/disconnect node n2 provides the simulated bus parallel termination through terminating resistor RL2 and the terminating voltage source provided by op amp A2 and its first feedback circuit through switch S5. The controlling terminating voltage $V_{TT}$ is applied at the controlling voltage input of op amp A2 by the PIN $V_{TT}$/PMU DAC through switch S14. A2 in turn maintains $V_{TT}$ at the terminating side of RL2.

Figure 5:
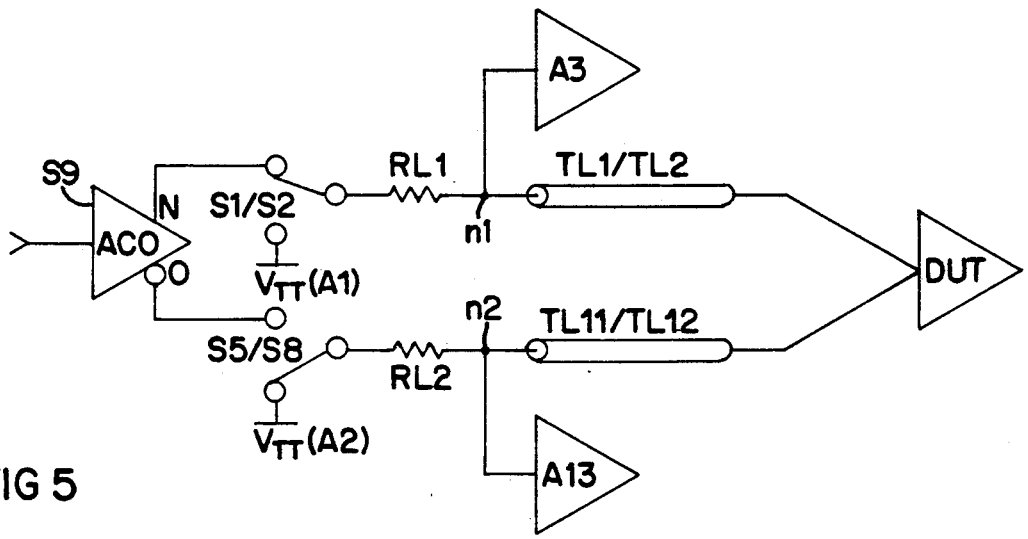
FIG. 5 is a fragmentary schematic circuit diagram of the double electrical path pin electronics test circuit simplified from FIG. 4. Both electrical paths of the pin electronics test circuit are coupled to the same pin of a DUT for driving AC test signals in the bus mode for testing bus type ECL IC devices.

A simplification of the dual pin lead electrical paths through test connect/disconnect nodes n1 and n2 for testing in the bus mode is illustrated in the simplified circuit of FIG. 5. In the simplification circuit of FIG. 5 equivalent components corresponding to elements of FIG. 4 or performing equivalent functions are indicated by the same reference designations.

Referring to FIG. 5, the push pull driver amplifier ACO is the current sink current switch S9 provided by the differential transistor pair Q1,Q2 and current sources $I_{HI}$ and $I_{LO}$ as shown in FIG. 3. In the bus mode, the collector lead of only one of the differential pair transistor elements Q1 and Q2 is coupled to test connect/disconnect nodes n1 for applying logic high and low potential level signals. With switch S1 closed and S2 open and switch S9 operating in the switching mode in response to data input signals, AC test signals are applied at node n1 to a pin of the bus type ECL DUT through the first electrical path TL1/TL2.

The controlled impedance path continues, returning from the selected DUT pin through the second pin lead electrical path TL11/TL12 and node n2, through terminating resistor RL2, and to the terminating voltage source A2 which is set at the terminating voltage $V_{TT}$. The terminating voltage $V_{TT}$ and terminating resistor RL2 thus provide a parallel termination for simulated bus mode testing. The simulated bus is a folded transmission line path with the pin of the ECL DUT coupled to the center of the folded transmission line simulating a bus type user environment. The loci of both ends of the transmission line path are in the pin electronics test circuit unit which may be on a single PEC. Sensing and measurement can be provided on both of the folded paths for example by comparators A3 and A13. Each comparator has two inputs, one input connected to the respective first or second electrical path and the other to a controlled voltage source. Preferably a single comparator may be used.

The alternative switch position configurations for all testing required in the bus simulation mode are summarized in Table II. For DC parameter testing in the bus mode, the simulated transmission line termination through the second electrical path is made electrically "invisible" by "bootstrapping". Switch S18 is coupled to the "−" terminal of op amp A12 and thereby forces the same voltage at each end of the second electrical path terminating resistor RL2. The termination on the second electrical path is therefore effectively electrically disconnected for DC parameter testing of bus mode type ECL devices.

The basic pin electronic test circuit in a switch position configuration for testing differential output ECL devices in the complementary mode is illustrated in FIG. 6. As shown in FIG. 6 the respective first and second pin lead electrical paths through respective test connect/disconnect nodes n1, n2 and pin lead couplings PIN, $\overline{PIN}$ are coupled to separate complementary pins of the differential output ECL DUT. In the example of FIG. 6 these are complementary input pins of the ECL DUT.

Figure 7:
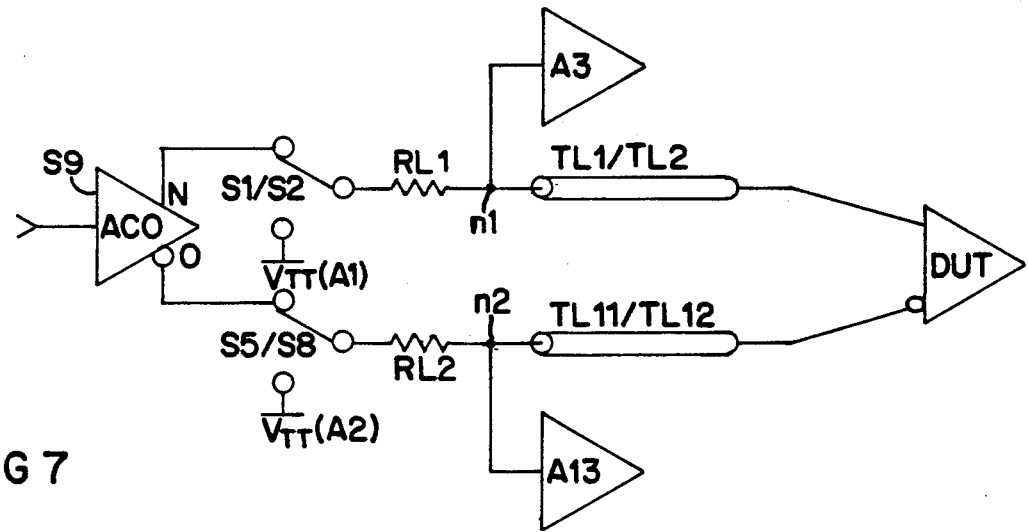
FIG. 7 is a fragmentary schematic circuit diagram of the double electrical path pin electronics test circuit simplified from FIG. 6. The two electrical paths are coupled respectively to complementary pins of a DUT for driving AC test signals in the complementary mode for testing differential output ECL IC devices.

A simplification of the complementary mode test configuration for driving AC test signals at complementary input pins of a differential type ECL device is illustrated in FIG. 7. With switch S1 closed and S2 open the first pin lead electrical path is coupled to one of the complementary outputs of differential transistor pair current sink current switch S9. With switch S5 closed and switch S8 open the second pin lead electrical path is coupled to the other complementary output of switch S9. Logic high and low potential level signals of opposite phase are therefore applied at the complementary input pins of the differential type ECL DUT for AC parameter testing or AC function testing. Alternative switch position configurations of the basic pin electronic circuit of FIG. 6 for testing of differential type ECL devices in the complementary mode are summarized in Table III. Other test circuit configurations for complementary mode testing can be achieved by different permutations and combinations of the switch configurations of Table III and FIG. 6. For sensing pin signals in the complementary mode, a single comparator is connected with the inputs coupled across the first and second paths e.g. at nodes n1 and n2.

Figure 8:
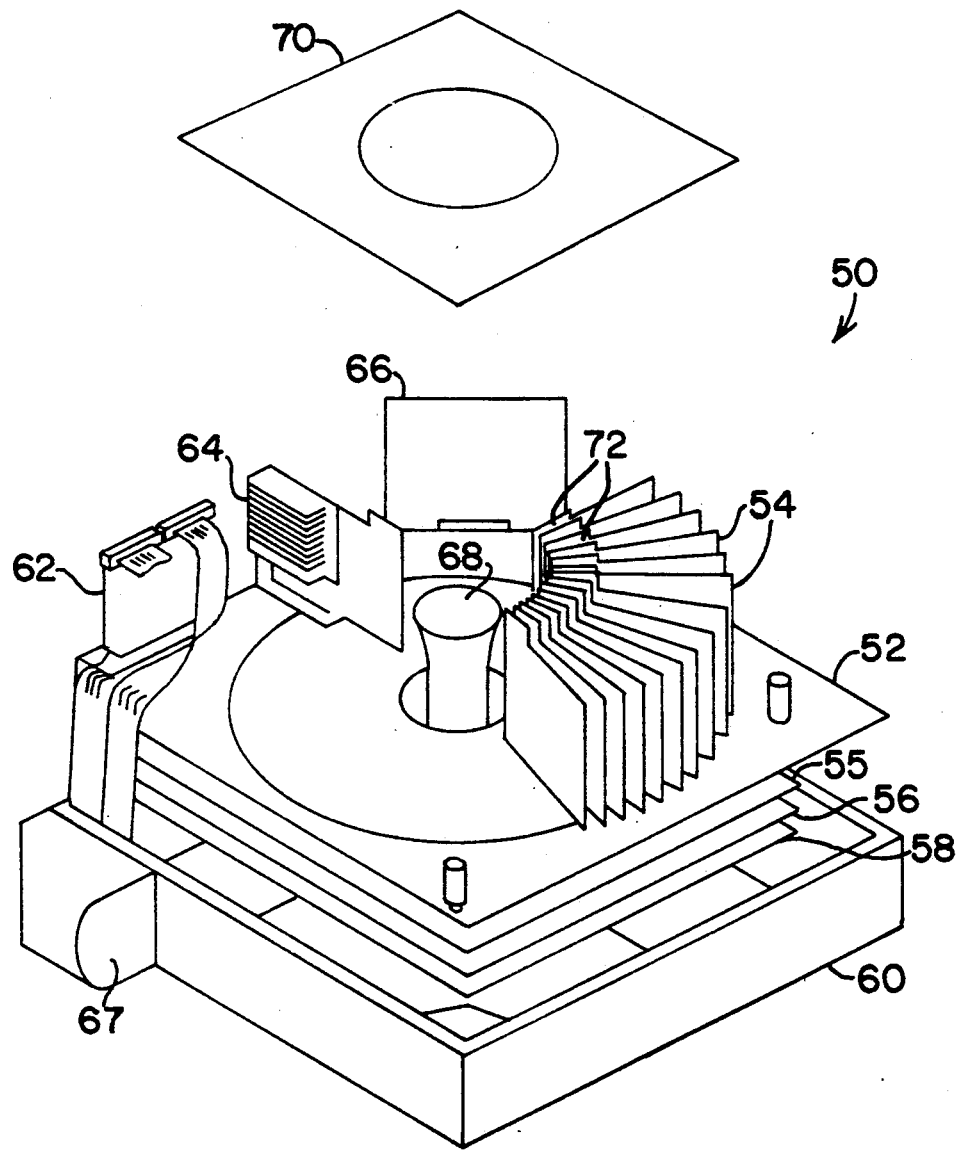
FIG. 8 is a simplified diagrammatic environmental perspective view of the test head of an example IC device tester incorporating pin electronics test circuits according to the invention on pin electronics cards (PEC's).

An environmental view of the locus of the pin electronics test circuits of the invention in the test head 50 of a typical microprocessor controlled digital logic IC device tester is illustrated in FIG. 8. Each pin electronic test circuit unit as illustrated, for example in FIGS. 1,4 or 6 is mounted on a separate pin electronics card 54, one PEC for each pin or group of pins of the DUT. The PECs 54 are mounted vertically in a radial array on the motherboard 52 which provides the distribution bus, for distributing test control signals to the respective PECs 54 from a CPU controller and motherboard interface 62. Other components of the test head 50 may include for example a timing generator board 55, supplemental AC measurement board 56, and functional sequencer 58 all housed in the frame 60. Air ventilation fixtures 67 and 68, reference generator 66, and auxiliary power supply 64 are also shown. The DUT loadboard 70 is installed horizontally over the PECs 54 by suitable electrical connectors 72 secured to the respective PEC's 54 and extending above the PEC's to engage complementary couplings on the DUT loadboard 70 not shown. Suitable electrical connectors are described in copending U.S. Patent application Ser. No. 07/639,586 for MECHANICALLY COMPLIANT HIGH FREQUENCY ELECTRICAL CONNECTOR referred to above. The DUT is typically indexed in a contactor at the center of the DUT loadboard with printed circuit leads to the pin lead electrical path couplings.

While the invention has been described with reference to particular example embodiments it is intended to cover all variations and equivalents within the scope of the following claims.

TABLE 1

Single Ended Mode Switch Configurations

| Switch ID | Single Ended AC Test Signal Driving | Single Ended Listening to AC Pin Signals | Single Ended DC Test Voltage Forcing & Current Measuring | Single Ended DC Test Current Forcing & Voltage Measuring |
|---|---|---|---|---|
| S1 | C | C | 0 | 0 |
| S2 | 0 | C | C | C |
| S3 | 0 | 0 | C | 0 |
| S4 | 0 | 0 | 0 | C |
| S5 | C | C | C | C |
| S6 | 0 | 0 | 0 | 0 |
| S7 | 0 | 0 | 0 | 0 |
| S8 | 0 | C | C | C |
| S8A | C | C | C | C |
| S9 | S | NS | NS | NS |
| S11 | 0 | 0 | 0 | C |
| S12 | 0 | 0 | C | 0 |
| S14 | C | C | 0 | 0 |
| S15 | 0 | 0 | 0 | 0 |
| S16 | 0 | 0 | 0 | 0 |
| S17 | 0 | 0 | 0 | 0 |
| S18 | S17 | S17 | S17 | S17 |

TABLE II

Bus Mode Switch Configurations

| Switch ID | Bus Mode AC Test Signal Driving | Bus Mode Listening to AC PIN Signals | Bus Mode DC Test Voltage Forcing & Current Measuring | Bus Mode DC Test Current Forcing & Voltage Measuring |
|---|---|---|---|---|
| S1 | C | C | 0 | 0 |
| S2 | 0 | C | C | C |
| S3 | 0 | 0 | C | 0 |
| S4 | 0 | 0 | 0 | C |
| S5 | C | C | C | C |
| S6 | 0 | 0 | 0 | 0 |
| S7 | 0 | 0 | 0 | 0 |
| S8 | 0 | C | C | C |
| S8A | 0 | 0 | 0 | 0 |
| S9 | S | NS | NS | NS |
| S11 | 0 | 0 | 0 | C |
| S12 | 0 | 0 | C | 0 |
| S14 | C | C | 0 | 0 |
| S15 | 0 | 0 | 0 | 0 |
| S16 | 0 | 0 | 0 | 0 |
| S17 | 0 | 0 | 0 | 0 |
| S18 | S17 (no bootstrap) | S17 (no bootstrap) | RC2/A12- (bootstrap) | RC2/A12- (bootstrap) |

TABLE III

Selected Example Differential Mode Switch Configurations

| Switch ID | Diff. Mode AC Test Signal Driving | Diff. Mode Listening to AC Pin Signals | Diff. Mode DC Test Voltage Forcing (1) + (2) & Current Measuring (1) | Diff. Mode DC Test Current Forcing (1) + (2) & Voltage Measuring (2) |
|---|---|---|---|---|
| S1 | C | C | 0 | 0 |
| S2 | 0 | C | C | C |
| S3 | 0 | 0 | C | 0 |
| S4 | 0 | 0 | 0 | C |
| S5 | C | C | 0 | 0 |
| S6 | 0 | 0 | C | 0 |
| S7 | 0 | 0 | 0 | C |
| S8 | 0 | C | C | C |
| S8A | C | C | C | C |
| S9 | S | NS | NS | NS |
| S11 | 0 | 0 | 0 | 0 |
| S12 | 0 | 0 | C | 0 |
| S14 | C | C | 0 | 0 |
| S15 | 0 | 0 | 0 | C |
| S16 | 0 | 0 | 0 | 0 |
| S17 | 0 | 0 | C | C |
| S18 | S17 | S17 | S17 | S17 |

TABLE IV

Electronic Switch Descriptions

| Switch ID | Electronic Switch Type | Switch functions |
|---|---|---|
| S1 | FET | Connect $V_{TT}$ Termination (1) |
| S2 | CSCS | Disable/Enable AC Test Signals (1) |
| S3 | FET | Force DC Test Voltage V (1) |
| S4 | FET | Force DC Test Current I (1) |
| S5 | FET | Connect $V_{TT}$ Termination (2) |
| S6 | FET | Force DC Test Voltage V (2) |
| S7 | FET | Force DC Test Current I (2) |
| S8 | CSCS | Disable/Enable AC Test Signals (2) |
| S8A | FET | Single ended and Diff. Mode AC Test Signal Drive (2) |
| S9 | CSCS | Logic Level High & Lo Switching (1) & (2) |
| S11 | FET | Measure pin DC voltage V (1) |
| S12 | FET | Measure Pin DC Current I (1) |
| S14 | FET | Bus & Diff. Modes AC Test Signal Drive & Measure (1) & (2) (S17 open) |

TABLE IV-continued

Electronic Switch Descriptions

| Switch ID | Electronic Switch Type | Switch functions |
|---|---|---|
| S15 | FET | Measure Pin DC voltage V (2) |
| S16 | FET | Measure Pin DC current I (2) |
| S17 | FET | Diff. Mode DC Test Signal Force & Measure (2) (S14 open) |
| S18 | FET | Bootstrap Switch for Bus Mode Force & Measure (1) and Bootstrapping (2) |

I claim:

1. Pin electronics test means for applying test signals at a pin of an integrated circuit (IC) device under test (DUT) and for sensing pin signals received from a pin of the DUT, said pin electronics test means comprising:

test signal first electrical path means having a test connect and disconnect first node, said first electrical path means defining a test signal path between said first node and a first path coupling for electrical connection to a pin of a DUT;

a first terminating resistor coupled to said first node;

first forcing amplifier means having an output coupled to said first terminating resistor, said forcing amplifier means having a first control input for applying a controlling signal, and a second feedback input;

a first feedback circuit coupled between the forcing amplifier means output and said feedback input for applying a steady state first terminating voltage source in series with the first terminating resistor;

said first terminating resistor, first feedback circuit, and first terminating voltage source forming a first terminating means providing substantially the function of a transmission line parallel termination for the first electrical path means for receiving pin signals from a pin of a DUT;

first electronic switch means coupled in the first feedback circuit for electrically connecting and disconnecting the first terminating means with respect to said first node;

AC test signal generating means coupled to said first node for generating and switching between AC test signals comprising data test signals of logic high and low potential levels and for driving said AC test signals on the first electrical path means for stimulating a pin of a DUT;

second electronic switch means coupled for electrically connecting and disconnecting the AC test signal generating means with respect to said first node;

at least a second feedback circuit coupled between the first node and said feedback input of the forcing amplifier means;

said second feedback circuit and first forcing amplifier means providing a first DC test signal generating means coupled to said first node for generating steady state DC test signals and forcing a DC test signal at a pin of a DUT;

third electronic switch means coupled in the second feedback circuit for electrically connecting and disconnecting the first DC test signal generating means with respect to said first node;

and measuring means coupled to said test connect and disconnect first node for sensing and measuring pin signals from a pin of a DUT.

2. The pin electronics test means of claim 1 wherein the second feedback circuit is coupled between a pin of a DUT and the feedback input of the forcing amplifier means, said first DC test signal generating means providing a steady state voltage generating means for forcing a steady state voltage DC test signal at a pin of a DUT.

3. The pin electronics test circuit of claim 2 wherein the first DC test signal generating means comprises a third feedback circuit coupled to provide a steady state current generating means for forcing a steady state current DC test signal at a pin of a DUT;

and fourth electronic switch means coupled in the third feedback circuit for electrically connecting and disconnecting the steady state current generating means with respect to said first node.

4. The pin electronics test means of claim 3 further comprising:

test Signal second electrical path means having a test connect and disconnect second node, said second electrical path means defining a test signal path between said second node and a second path coupling for electrical connection to a pin of a DUT;

second terminating means comprising a second terminating resistor and second terminating voltage source coupled in series to said second node providing substantially the function of a transmission line parallel termination for the second electrical path means for receiving pin signals from a pin of a DUT;

and fifth electronic switch means coupled for electrically connecting and disconnecting the second terminating means with respect to said second node.

5. The pin electronics test means of claim 4 further comprising:

second DC test signal generating means coupled to said second node for generating DC test signals comprising steady state voltage generating means for generating a steady state voltage DC test signal on the second electrical path means and forcing said voltage DC test signal at a pin of a DUT, and steady state current generating means for generating a steady state current DC test signal on the second electrical path means and forcing said current DC test signal at a pin of a DUT;

sixth electronic switch means coupled for electrically connecting and disconnecting the steady state voltage generating means with respect to said second node;

seventh electronic switch means coupled for electrically connecting and disconnecting the steady state current generating means with respect to said second node;

said measuring means being coupled to said test connect and disconnect second node for sensing and measuring pin signals from a pin of a DUT.

6. The pin electronics test means of claim 4 wherein the AC test signal generating means comprises a complementary output signal generating means having complementary first and second outputs for delivering respective logic high and low potential level data test signals in opposite phase, said complementary output signal generating means first output being coupled to the first node, said second electronic switch means electrically connecting and disconnecting said first output with respect to said first node, said complementary output signal generating means second output being coupled to the second node, and an eighth electronic switch means coupled for electrically connecting and disconnecting said second output with respect to said second node.

7. The pin electronics test means of claim 6 wherein the first path coupling of the first electrical path means and the second path coupling of the second electrical path means are electrically connected to different pins of a DUT for testing differential output ECL type DUT's in a complementary output mode.

8. The pin electronics test of claim 7 wherein the second and eighth electronic switch means are closed connecting the respective first and second complementary outputs of the AC test signal generating means to the respective first and second nodes.

9. The pin electronics test means of claim 4 wherein the first path coupling of the first electrical path means and the second path coupling of the second electrical path means are electrically connected to the same pin of a DUT for testing bus type DUT's in the bus mode.

10. The pin electronics test means of claim 9 wherein the second electronic switch means is closed connecting the AC test signal generating means to the first node and wherein the fifth electronic switch means is closed connecting the second terminating means to the second node.

11. The pin electronics test means of claim 4 wherein the first and second electrical path means, the first and second terminating means, AC test signal generating means, first and second DC signal generating means, and measuring means are formed on a single pin electronics card or board (PEC).

12. The pin electronics test means of claim 10 further comprising:
a DUT board having pin contacts for indexing a DUT for testing, said DUT board being formed with a first electrical path means continuation to a pin contact and a second electrical path means continuation to a pin contact;
and an interconnect interface electrically connecting the PEC and DUT board with electrical continuity between the first electrical path means and first electrical path means continuation and between the second electrical path means and second electrical path means continuation.

13. The pin electronics test means of claim 12 wherein the first and second electrical path means continuations on the DUT board are coupled to the same pin contact for testing bus type DUT's in the bus mode.

14. The pin electronics test means of claim 12 wherein the first and second electrical path means continuations are connected to different pin contacts for testing differential type ECL devices in the complementary output mode.

15. The pin electronics test means of claim 1 wherein the AC test signal generating means comprises a three level current switch means coupled to said first node for alternatively establishing a first high level current through the first terminating resistor for a logic high potential level data test signal at the first node, establishing a second low level current through the first terminating resistor for a logic low potential level data test signal at the first node, and electrically turning off a current through the terminating resistor below a threshold level for disconnecting the AC signal generating means from the first node.

16. The pin electronics test means of claim 1 wherein the AC test signal generating means comprises:

a first current source coupled to said first node through a disconnect diode element oriented for conduction of current to the first node, said first current source being coupled between a high potential level power rail and said disconnect diode element for sourcing current through the terminating resistor and establishing a logic high potential level data test signal at said first node; and
a logic level current sink switch coupled between the anode lead of said disconnect diode element and a low potential level power rail for diverting a first fractional portion of current from the first current source away from the disconnect diode element and terminating resistor for establishing a logic low potential level data test signal at said first node when the logic level current sink switch is closed;
and wherein the second electronic switch means comprises a disable current sink switch coupled between the anode lead of said disconnect diode element and a low potential level power rail for diverting a second fractional portion of current from the first current source away from the disconnect diode element causing the potential drop across the disconnect diode element to fall below the diode element threshold voltage level for disconnecting the AC test signal generating means from the first node.

17. The pin electronics test means of claim 6 wherein the AC test signal generating means comprises:
a first current source coupled to the first node of the first electrical path means through a first disconnect diode element oriented for conduction to the first node, said first current source being coupled between a high potential level power rail and said first disconnect diode element for sourcing current through the first terminating resistor for establishing a logic high potential level data test signal at said first node;
a second current source coupled to the second node of the second electrical path means through a second disconnect diode element oriented for conduction to the second node, said second current source being coupled between a high potential level power rail and said second disconnect diode element for sourcing current through the second terminating resistor and establishing a logic high potential level data test signal at said second node;
and a differential logic level current sink switch having complementary first and second current switch paths, said first current switch path being coupled between the anode lead of the first disconnect diode element and a low potential level power rail for diverting a first fractional portion of current from the first current source away from the first disconnect diode element and first terminating resistor for establishing a logic low potential level data test signal at said first node when the first current switch path is closed, said second current switch path being coupled between the anode lead of the second disconnect diode element and a low potential level power rail for diverting a first fractional portion of current from the second current source away from the second disconnect diode element and second terminating resistor for establishing a logic low potential level data test signal at said second node when the second current switch path is closed, said first and second current switch paths being opened and closed in opposite phase.

18. The pin electronics test means of claim 17 wherein the second electronic switch means comprises a first disable current sink switch coupled between the anode lead of said first disconnect diode element and a low potential level power rail for diverting a second fractional portion of current from the first current source away from the first disconnect diode element causing the potential drop across the first disconnect diode element to fall below the diode threshold voltage level for disconnecting the AC test signal generating means from the first node.

19. The pin electronics test means of claim 18 further comprising a second disable current sink switch coupled between the anode lead of said second disconnect diode element and a low potential level power rail for diverting a second fractional portion of current from the second current source away from the second disconnect diode element causing the potential drop across the second disconnect diode element to fall below the diode threshold voltage level for disconnecting the AC test signal generating means from the second node, said second disable current sink switch comprising the eighth electronic switch.

20. The pin electronics test means of claim 3 wherein the first forcing amplifier means and first terminating voltage source comprises a first operational amplifier (op amp) having a controlling voltage signal input, a feedback input, and an output coupled to the terminating resistor.

21. The pin electronics test means of claim 20 wherein the steady state current generating means for forcing a selected current DC test signal at a pin of a DUT comprises said third feedback circuit including a first instrumentation amp having first and second inputs coupled respectively to the ends of the first terminating resistor and an output coupled to the feedback input of the first op amp, said fourth electronic switch means being coupled in the third feedback circuit.

22. The pin electronics test means of claim 21 wherein the first, third and fourth electronic switch means comprise FET switches, and wherein the second electronic switch means comprises a current sink switch.

23. The pin electronics test means of claim 21 further comprising a first decoupling resistor in the second feedback circuit, and a second decoupling resistor in the third feedback circuit.

24. The pin electronics test means of claim 3 wherein the first, third, fourth, fifth, sixth, and seventh electronic switch means comprise FET switches and wherein the second and eighth electronic switch means comprise current sink switches.

25. A pin electronics card or unit (PEC) for applying test signals at a pin of an integrated circuit (IC) device under test (DUT) and for sensing pin signals received from a pin of the DUT, said PEC having motherboard coupling means for coupling to a motherboard of a test head of an IC device tester for receiving test control signals from the tester, and DUT board interconnect coupling means for coupling to a DUT board of the test head for driving and forcing test signals at a pin of a DUT mounted on the DUT board and for sensing and measuring pin signals received from a pin of a DUT mounted on the DUT board, said PEC comprising:

test signal first electrical path means having a test connect and disconnect first node, said first electrical path means defining a test signal path between said first node and a first path coupling coupled to the DUT board interconnect coupling means for electrical connection to a pin of a DUT;

first terminating means comprising a first terminating resistor and first terminating voltage source coupled in series to said first node providing substantially the function of a transmission line parallel termination for the first electrical path means for receiving pin signals from a pin of a DUT;

first electronic switch means for electrically connecting and disconnecting the first terminating means with respect to said first node;

AC test signal generating means coupled to said first node for generating and switching between AC test signals comprising data test signals of logic high and low potential levels and for driving said AC test signals on the first electrical path means for stimulating a pin of a DUT;

second electronic switch means for electrically connecting and disconnecting the AC test signal generating means with respect to said first node;

measuring means coupled to said test connect and disconnect first node for sensing and measuring pin signals from a pin of a DUT;

test signal second electrical path means having a test connect and disconnect second node, said second electrical path means defining a test signal path between said second node and a second path coupling coupled to the DUT board interconnect coupling means for electrical connection to a pin of a DUT;

second terminating means comprising a second terminating resistor and second terminating voltage source coupled in series to said second node providing substantially the function of a transmission line parallel termination for the second electrical path means for receiving pin signals from a pin of a DUT and for providing a bus mode termination;

fifth electronic switch means for electrically connecting and disconnecting the second terminating means with respect to said second node;

said measuring means being coupled to said test connect and disconnect second node for sensing and measuring pin signals from a pin of a DUT.

26. The PEC of claim 25 further comprising:

a DUT board having pin contacts for indexing a DUT for testing, said DUT board being formed with a first electrical path means continuation to a pin contact and a second electrical path means continuation to a pin contact;

said DUT board interconnect coupling means electrically connecting the PEC and DUT board with electrical continuity between the first electrical path means and first electrical path means continuation and between the second electrical path means and second electrical path means continuation.

27. The PEC of claim 26 wherein the first and second electrical path means continuations on the DUT board are coupled to the same pin socket for testing bus type DUT's in a bus mode.

28. The PEC of claim 26 wherein the AC test signal generating means comprises a complementary output signal generating means having complementary first and second outputs for delivering respective logic high and low potential level data test signals in opposite phase, said complementary output signal generating means first output being coupled to the first node, said second electronic switch means being coupled for electrically connecting and disconnecting said first output with respect to said first node, said complementary output signal generating means second output being coupled to the second node, and an eighth electronic switch means being coupled for electrically connecting and disconnecting said second output with respect to said second node.

29. The PEC of claim 28 wherein the first and second electrical path means continuations on the DUT board are connected to different pin contacts for testing complementary or differential type ECL devices in a complementary output mode.

30. A pin electronics circuit for applying test signals at a pin of an integrated circuit (IC) device under test (DUT) and for sensing pin signals received from a pin of the DUT, said pin electronics circuit comprising:

first and second test signal electrical path means having respective test connect and disconnect first and second nodes, said first and second electrical path means defining separate test signal paths between the respective first and second nodes and first and second path couplings for electrical connection to at least one pin of a DUT;

first and second terminating means comprising respective first and second terminating resistors and respective first and second terminating voltage sources coupled in series to said first and second nodes providing substantially the function of transmission line parallel terminations for the respective first and second electrical path means for receiving pin signals from at least one pin of a DUT;

first electronic switch means coupled for electrically connecting and disconnecting the first terminating means with respect to said first node;

test signal generating means coupled to said first node for generating and electronically switching between test signals and for applying said test signals on the first electrical path means for stimulating a pin of a DUT;

second electronic switch means coupled for electrically connecting and disconnecting the test signal generating means with respect to said first node;

measuring means coupled to said test connect and disconnect first node for sensing and measuring pin signals from a pin of a DUT;

third electronic switch means coupled for electrically connecting and disconnecting the second terminating means with respect to said second node.

31. The pin electronics test circuit of claim 30 wherein the first path coupling of the first electrical path means and the second path coupling of the second electrical path means are electrically connected to different pins of a DUT for testing differential output ECL type DUTs in a complementary output mode, wherein the test signal generating means is also coupled to the second node, wherein the measuring means is also coupled to said second node for sensing and measuring pin signals from a pin of a DUT, and fourth electronic switch means for electrically connecting and disconnecting the test signal generating means with respect to said second node.

32. The pin electronics test circuit of claim 30 wherein the first path coupling of the first electrical path means and the second path coupling of the second electrical path means are electrically connected to the same pin of a DUT for testing bus type DUT's in the bus mode.

* * * * *